(12) United States Patent
Kanno

(10) Patent No.: US 8,173,061 B2
(45) Date of Patent: May 8, 2012

(54) PATTERN TRANSFER METHOD

(75) Inventor: Masahiro Kanno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 12/730,649

(22) Filed: Mar. 24, 2010

(65) Prior Publication Data

US 2010/0270711 A1 Oct. 28, 2010

(30) Foreign Application Priority Data

Apr. 22, 2009 (JP) ................... 2009-104503

(51) Int. Cl.
*B29C 43/36* (2006.01)

(52) U.S. Cl. ........ 264/484; 264/446; 264/447; 264/494; 264/496

(58) Field of Classification Search .................. 264/446, 264/447, 484, 494, 496, DIG. 45
See application file for complete search history.

(56) References Cited

U.S. PATENT DOCUMENTS

| | | | | |
|---|---|---|---|---|
| 4,119,688 A | * | 10/1978 | Hiraoka | 264/101 |
| 6,391,217 B2 | * | 5/2002 | Schaffer et al. | 264/485 |
| 6,908,861 B2 | | 6/2005 | Sreenivasan et al. | |
| 6,964,793 B2 | | 11/2005 | Willson et al. | |
| 2004/0036201 A1 | * | 2/2004 | Chou et al. | 264/402 |
| 2008/0217822 A1 | * | 9/2008 | Chou et al. | 264/496 |

FOREIGN PATENT DOCUMENTS

| | | |
|---|---|---|
| JP | 2004-311514 | 11/2004 |
| JP | 2005-527974 | 9/2005 |
| WO | WO 03/099536 A1 | 12/2003 |

* cited by examiner

*Primary Examiner* — Joseph Del Sole
*Assistant Examiner* — Timothy Kennedy
(74) *Attorney, Agent, or Firm* — Finnegan, Henderson, Farabow, Garrett & Dunner, L.L.P.

(57) ABSTRACT

A pattern transfer method for filling a surface on a template having a concave-convex pattern with a resist material has contacting the template with the resist material applied on a substrate, curing the resist material while contacting the template with the resist, electrically charging the template and the resist with an identical polarity, and removing the template from the resist material while eclectically charging the template and the resist with an identical polarity.

14 Claims, 11 Drawing Sheets

PATTERN TRANSFER METHOD

CROSS REFERENCE TO RELATED APPLICATIONS

This application is based upon and claims the benefit of priority from the prior Japanese Patent Application No. 2009-104503 filed on Apr. 22, 2009, the entire contents of which are incorporated herein by reference.

BACKGROUND OF THE INVENTION

1. Field of the Invention

The invention relates to a pattern transfer method, especially, a pattern transfer method using an imprint lithography technology for transferring a micropattern.

2. Related Art

In a manufacturing process of semiconductor devices, a nano-imprint technology to transfer a shape of an original plate to a substrate to be transferred is attracted as a technology which can satisfy both formation of a micropattern and mass productivity. The nano-imprint technique is a technique where the shape of the original plate (template), on which a pattern to be transferred is formed, is pressed to a resist applied on the substrate to be transferred, and then the resist is cured, thereby transferring the pattern formed on the original plate to the resist.

The imprint lithography is divided into some types such as a light (UV) imprint and a heat imprint according to the imprint agent (curing way). The light imprint lithography has a step of coating the substrate to be processed with a light curing imprint agent, a step of aligning the substrate to be processed with the translucent template (alignment), a step of contacting the template with the light curing imprint agent, a step of curing the light curing imprint agent by light irradiation at this state, and a step of removing the template (template-removing) from the cured light curing imprint agent (resist pattern).

For example, Patent Document 1 (JP-A No. 2005-527974 (Kohyo)) discloses a technique to press a template to a substrate having a shape-formable surface by using a fluid induction pressure from an electric or magnetic field. More specifically, there has been proposed a technique where an assembly is arranged between conductive films and the electric field is applied between the films, and a technique where an assembly is arranged between films composed of magnetic materials and the magnetic field for combining the films is applied.

Furthermore, Patent Document 2 (JP-A No. 2004-311514 (Kokai)) discloses a technique to suppress degradation of a dimension controllability of a resist by neutralizing electric charges on the resist and a mold when the mold is in touch with the resist. More specifically, when the mold is in touch with the resist, the negative electric charge on the resist moves through a conductive film to the positive electric charge on the micropattern of the mold, thereby neutralizing the charges due to a static electricity on the mold and the resist.

However, the conventional imprint lithography has following problems. On the step of removing the template, because the resist has already been cured, a frictional force occurs between the pattern and the template depending on the contact area of the pattern and the template. That is, in a case of a pattern with a high aspect ratio, defects can occur, for example, the pattern is broken due to the frictional force or the like. Therefore, there have been problems that it is difficult to suppress the occurrence of the pattern defect on template-removing and to realize a high throughput of template-removing.

SUMMARY

According to one aspect of the present invention, a pattern transfer method for filling a surface on a template having a concave-convex pattern with a resist material comprising: contacting the template with the resist material applied on a substrate; curing the resist material while contacting the template with the resist; electrically charging the template and the resist with an identical polarity; and removing the template from the resist material while eclectically charging the template and the resist with an identical polarity.

According to the other aspect of the present invention, a pattern transfer method for filling a surface on a template having a concave-convex pattern with a resist material comprising: applying the resist material on the template; contacting the template and the resist material with a substrate; curing the resist material while contacting the template with the resist; and removing the template from the resist material while electrically charging the template and the resist are charged with an identical polarity.

DETAILED DESCRIPTION OF THE INVENTION

First Embodiment

Hereinafter, a pattern transfer method using an imprint lithography will be explained.

Figure 1A:
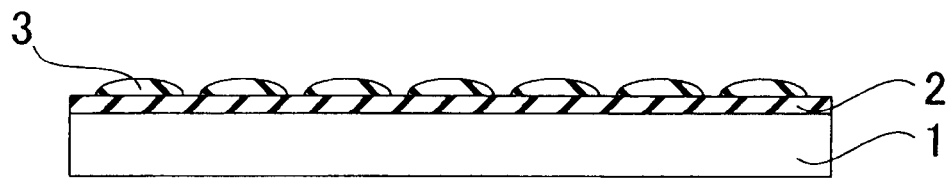
FIGS. 1A to 1D are process drawings schematically showing a pattern transfer method using an imprint lithography.

Firstly, as shown in FIG. 1A, a pattern transferred film 2 on a substrate 1 is coated with a light curing organic material (resist) 3. Here, the coating of the organic material 3 is performed by dispersing liquid drops of the organic material in accordance with an ink-jet manner. FIG. 1A shows an enlarged figure of several parts of the liquid drops among the dispersed liquid drops.

Figure 1B:
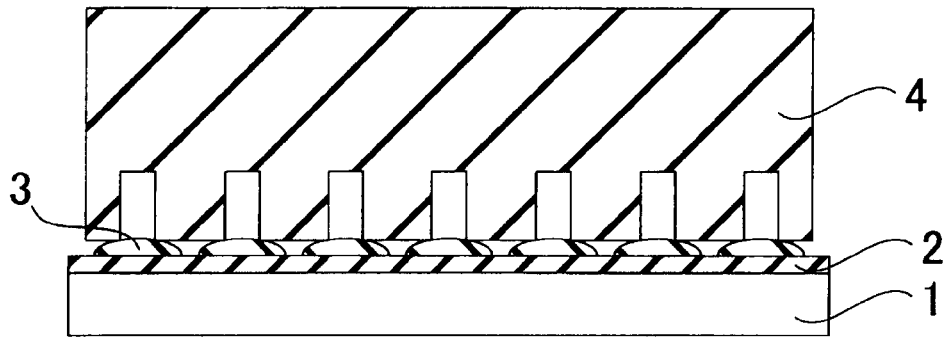
Figure 1C:
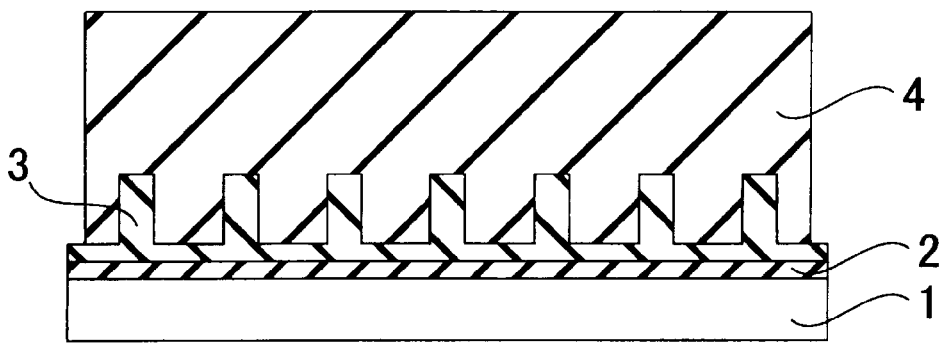
Figure 1D:
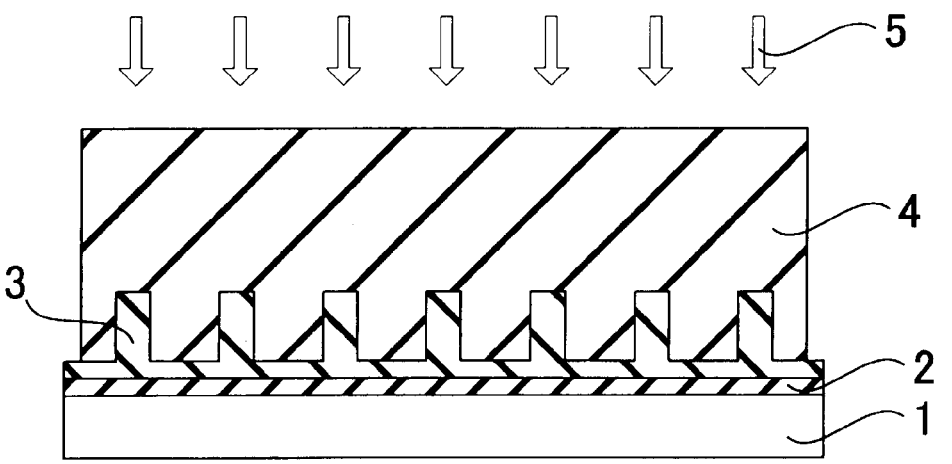

Secondly, as shown in FIG. 1B, a template 4 on which a pattern corresponding to one shot is formed is contacted with the organic material 3. Then, as shown in FIG. 1C, the template 4 is pressed on the wafer. The template 4 is kept in this state until the organic material 3 penetrates in the micropattern on the template 4.

Right after the template 4 is pressed, the penetration of the organic material 3 is not enough and filling defects occurs at the corners of the patterns. However, because the organic material 3 has flowability, the organic material 3 goes round the corners of the patterns by a capillary phenomenon. In this state, a light (UV) 5 is irradiated to cure the organic material 3.

Figure 2A:
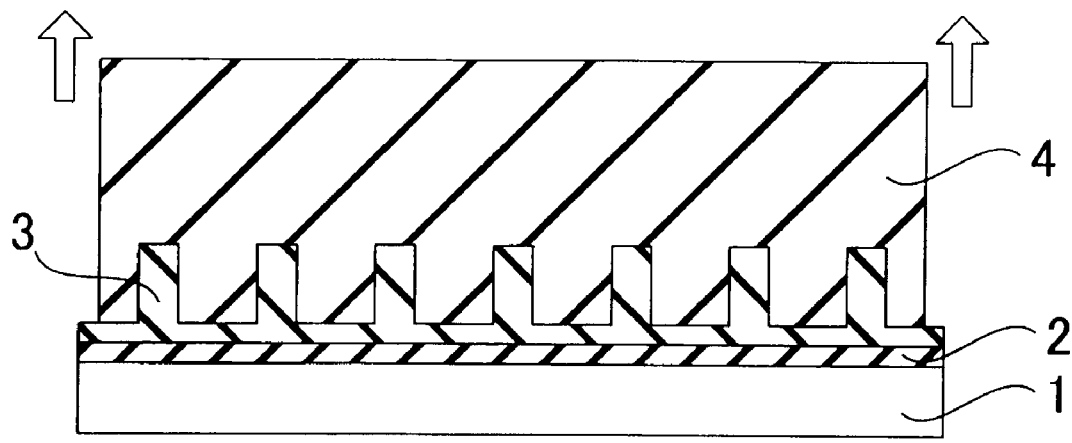
FIGS. 2A and 2B are process drawings schematically showing the pattern transfer method using the imprint lithography.
Figure 2B:
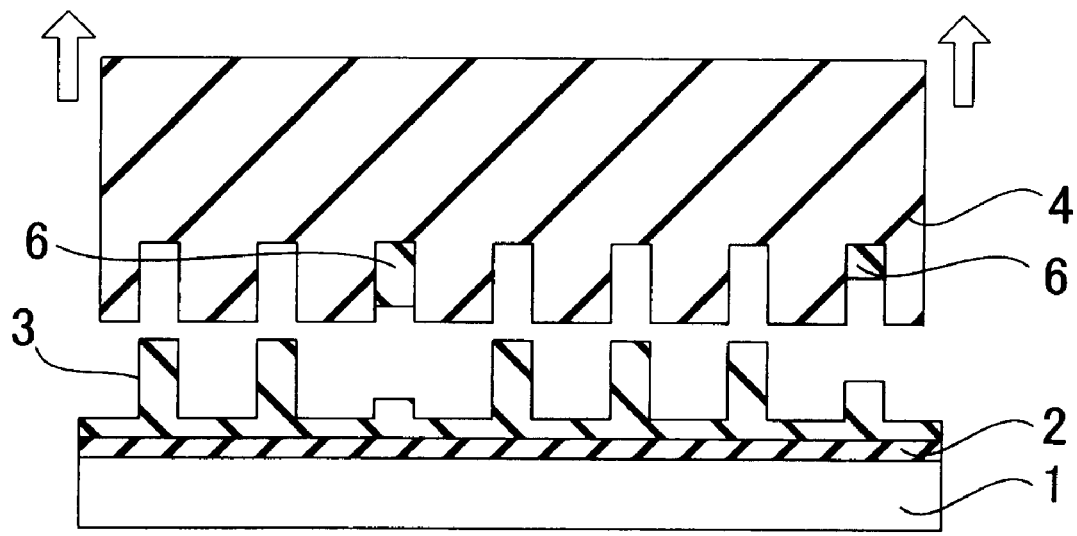

Then, as shown in FIG. 2A, the template 4 is removed from the organic material 3. By such a manner, concave-convex patterns on the template 4 are transferred to the organic material 3. However, at a time of template-removing, because the organic material 3 has already been cured, a frictional force occurs between the pattern and the template depending on the contact area of the pattern and the template. That is, as shown in FIG. 2B, in a case of a pattern with a high aspect ratio, defects 6 can occur, for example, the pattern is broken due to the frictional force or the like.

Therefore, one embodiment of the present invention focuses to suppress degradation at a time of template-removing and proposes a pattern transfer method using a template whose depth of the concave portion is adjusted.

Figure 3A:
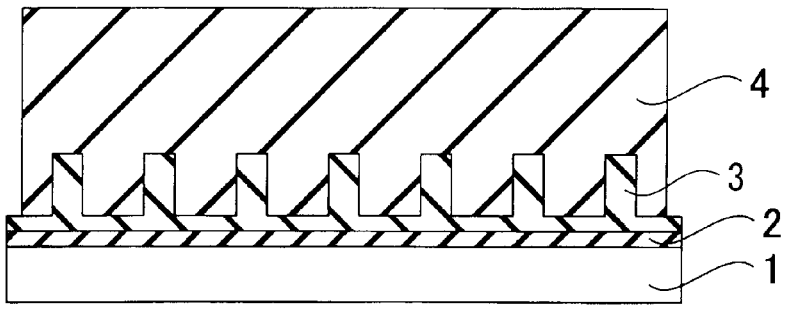
FIGS. 3A to 3C are process drawings schematically showing a pattern transfer method according to a first embodiment of the present invention.
Figure 3B:
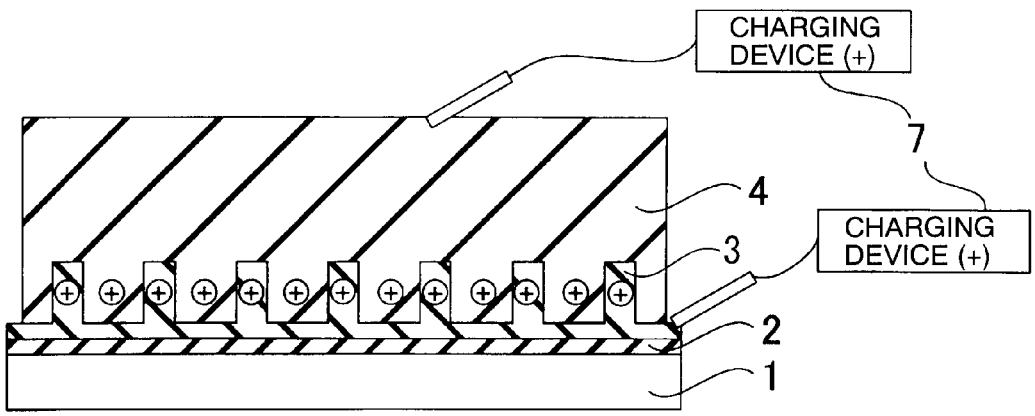
Figure 3C:
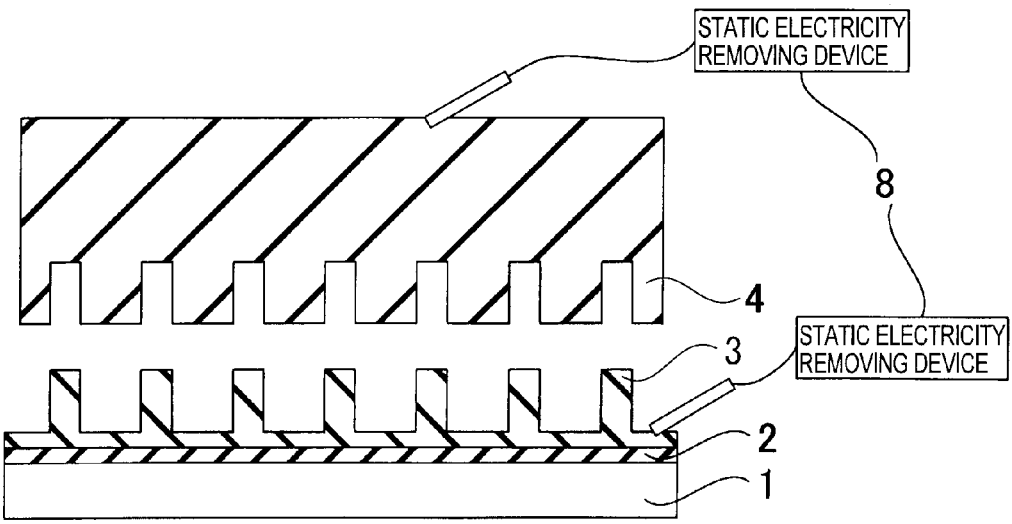

FIGS. 3A to 3C show process drawings of the pattern transfer method according to a first embodiment of the present invention, respectively. It is one of the characteristic features of the pattern transfer method according the first embodiment of the present invention to charge the template 4 and the organic material 3 with an identical polarity when the template 4 is removed.

Hereinafter, the present embodiment will be explained. FIG. 3A shows a state where the organic material 3 is cured by irradiating a light (UV) after the template 4 is pressed on the organic material 3. Here, as shown in FIG. 3B, the template 4 and the organic material 3 are electrically charged by the charging device 7. More specifically, both of one side of the template 4 contacting with the organic material 3, namely, the side on which the concave-convex patterns are formed, and the surface of the organic material 3, are electrically charged with the identical polarity. In the present embodiment, the template 4 and the organic material 3 are positively charged, as an example.

Figure 4:
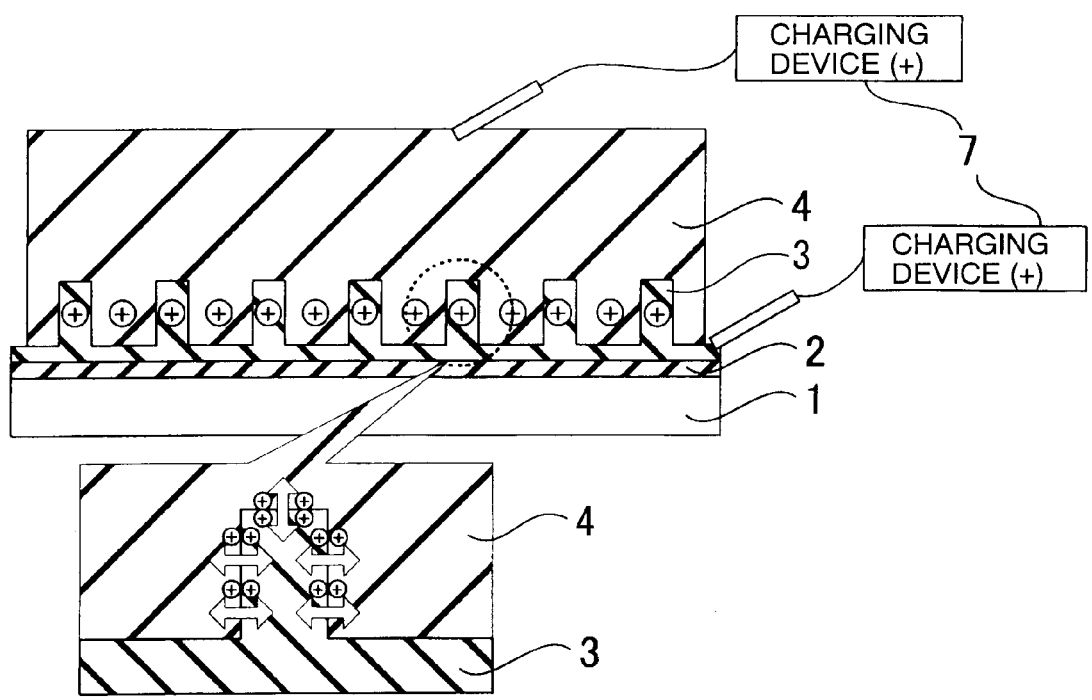
FIG. 4 is process drawing schematically showing the pattern transfer method according to the first embodiment of the present invention.

As shown in FIG. 4, by electrically charging the template 4 and the organic material 3 with the identical polarity, static electricity (repulsion force) occurs between the template 4 and the organic material 3, thereby removing the template 4 from the organic material 3 easily. Here, the amount of the electric charge on the template 4 and the organic material 3 can be arbitrarily varied and can be set according to the characteristics of the template 4 and the organic material 3.

After template-removing, as shown in FIG. 3C, the electric charge on the organic material 3 is removed by a static electricity removing device 8. Note that when a plurality of shots are performed successively, the electric charge on only one of the template 4 and the organic material 3 is removed and the next shot can be performed while the other is electrically charged.

Figure 5A:
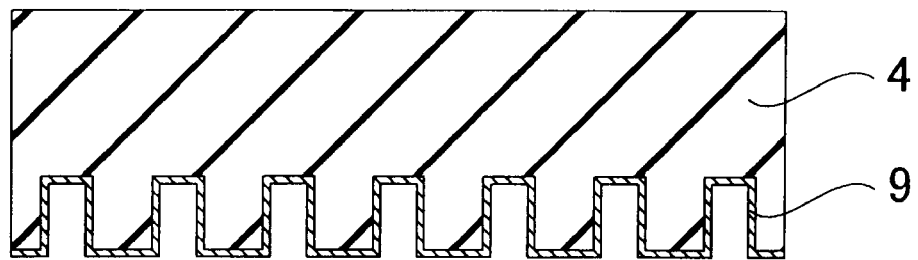
FIGS. 5A to 5C are process drawings schematically showing the pattern transfer method according to the first embodiment of the present invention.

Furthermore, as shown in FIG. 5A, the surface of the concave-convex patterns on the template 4 can be coated with a conductive film 9 such as a metallic film so that the electric charge is easily accumulated on the surface of the concave-convex patterns on the template 4. Because the electric charge is easily accumulated on the surface of the concave-convex patterns, the static electricity easily occurs between the template 4 and the organic material 3, thereby further suppressing the defect and realizing a high throughput. Therefore, it is preferable to use the conductive film 9.

Figure 5B:
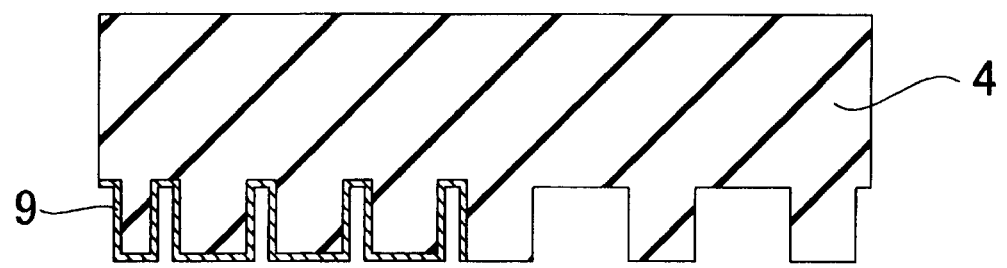
Figure 5C:
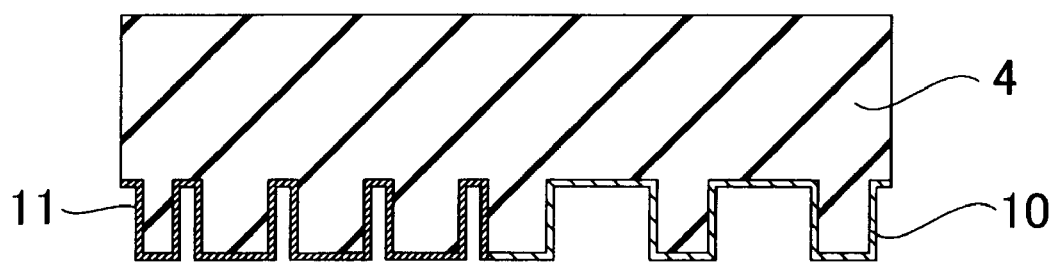

Additionally, the presence/absence of the conductive film and the material of the conductive film can be varied respectively according to the rough/fine, shape and/or aspect ratio of the concave-convex patterns on the template 4. For example, as shown in FIG. 5B, the conductive film 9 can be formed on an area where the density of the pattern is high and the conductive film 9 may not be formed on another area where the density of the pattern is low. That is, the conductive film 9 can be formed only on an area where the density of the concave-convex pattern is higher than a predetermined value. Furthermore, as shown in FIG. 5C, because the frictional force of the pattern with the high aspect ratio at a time of template-removing is higher than that of the other patterns, in order to improve the static electricity, a second conductive film 11 can be formed on the pattern with a high aspect ratio, the conductive property of the second conductive film 11 being higher than that of the first conductive film 10 formed on other patterns.

Note that the conductive film can be formed at least on the surface of the concave portion on the template 4 and may not be formed on the surface of the convex portion on the template 4. Furthermore, although the surface of the concave-convex patterns on the template 4 may be coated with a removing agent for easy template-removing, this does not cause any problems because the removing agent has a thickness that does not disturb an influence of the static electricity.

Figure 6A:
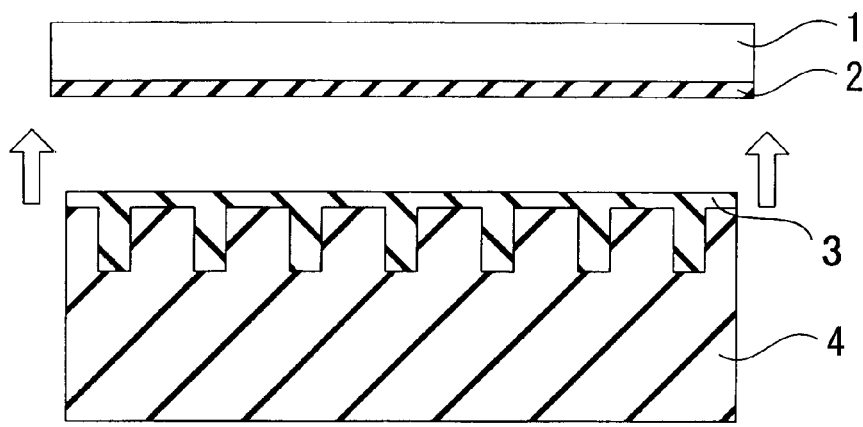
FIGS. 6A and 6B are process drawings schematically showing a pattern transfer method according to a modified example of the first embodiment of the present invention.
Figure 6B:
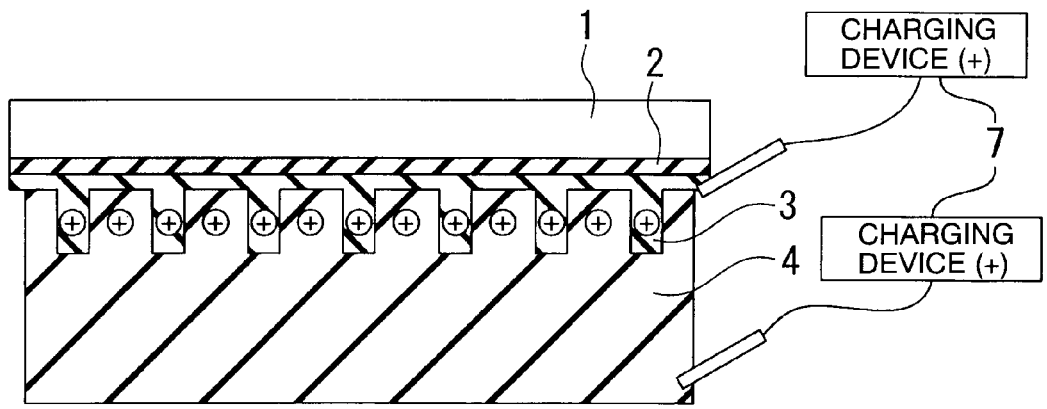

Subsequently, the pattern transfer method according to a modified embodiment of the first embodiment of the present invention will be explained hereinafter. FIGS. 6A and 6B show process drawings of the pattern transfer method according to the modified embodiment of the first embodiment of the present invention, respectively. This embodiment shows an example of an imprint lithography process in accordance with Face-Up manner. In a case of the imprint lithography in accordance with the Face-Up manner, as shown in FIG. 6A, after the template 4 is coated with the organic material 3 and the template 4 is pressed on the transferred film 2 on the substrate 1, the light (UV) is irradiated to cure the organic material 3. Then, as shown in FIG. 6B, by electrically charging the template 4 and the organic material 3 with the identical polarity, the static electricity (repulsion force) occurs between the template 4 and the organic material 3. Therefore, the template 4 can be easily removed from the organic material 3.

As mentioned above, with the pattern transfer method according to the first embodiment of the present invention, the static electricity occurs between the template 4 and the organic material 3, thereby easily removing the template 4 from the organic material 3. As a result, it is possible to suppress the defect at a time of template-removing and to realize the high throughput.

Second Embodiment

Figure 7A:
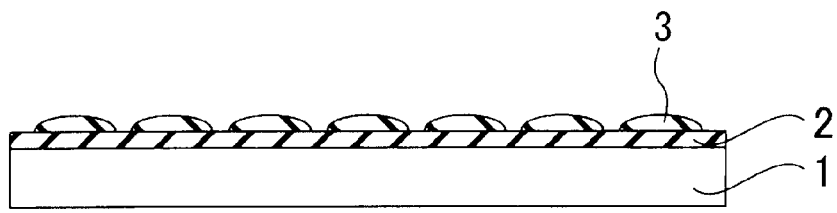
FIGS. 7A to 7C are process drawings schematically showing the pattern transfer method according to a second embodiment of the present invention.
Figure 7B:
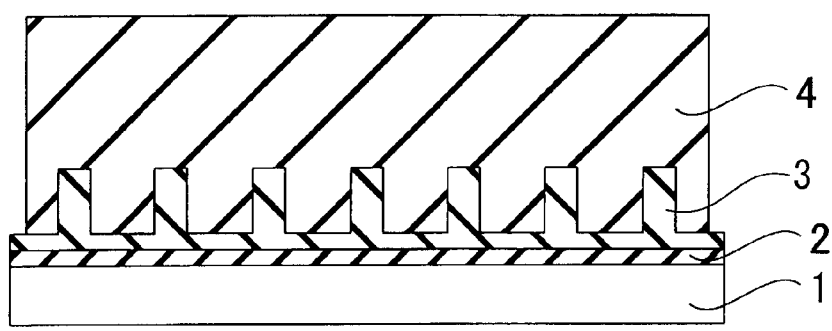
Figure 7C:
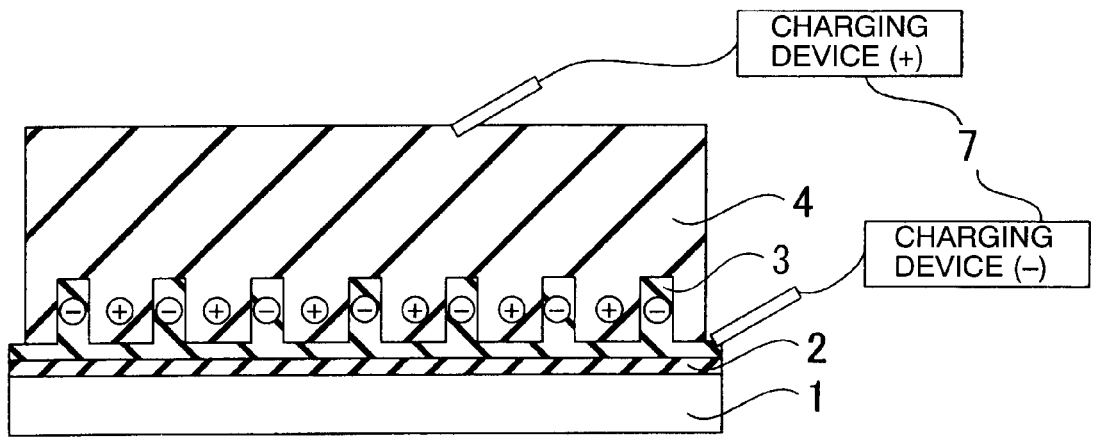

A pattern transfer method according to a second embodiment of the present invention will be explained. FIGS. 7A to 7C show process drawings of the pattern transfer method according to the second embodiment of the present invention, respectively. In the pattern transfer method according to the second embodiment of the present invention, in addition to the first embodiment, it is one of the characteristic features that the template 4 and the organic material 3 are further electrically charged with different polarities when the template 4 is pressed.

Hereinafter, the present embodiment will be explained. FIG. 7A shows a state where the pattern transferred film 2 on the substrate 1 is coated with the organic material 3. Then, as shown in FIG. 7B, the template 4 is pressed on the organic material 3. Here, as shown in FIG. 7C, the template 4 and the organic material are electrically charged by the charging device 7. More specifically, one side of the template 4 contacting with the organic material 3, namely, the side on which the concave-convex patterns of the template 4 are formed, and the surface of the organic material 3 are electrically charged with different polarities. In the present embodiment, the template 4 is positively charged and the organic material 3 is negatively charged, as an example.

By electrically charging the template 4 and the organic material 3 with the different polarities, static electricity (attraction force) occurs between the template 4 and the organic material 3, thereby easily filling the concave portion on the template 4 with the organic material 3. Here, the amount of the charge on the template 4 and the organic material 3 is arbitrarily varied and is set according to the characteristics of the template 4 and the organic material 3.

Figure 8A:
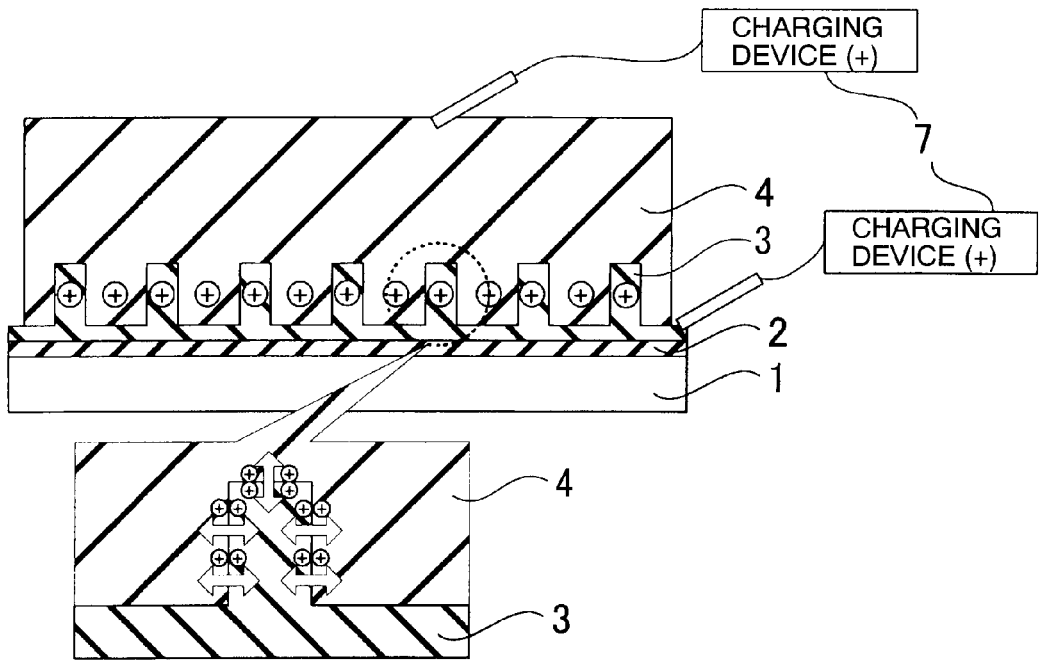
FIGS. 8A and 8B are process drawings schematically showing the pattern transfer method according to the second embodiment of the present invention.
Figure 8B:
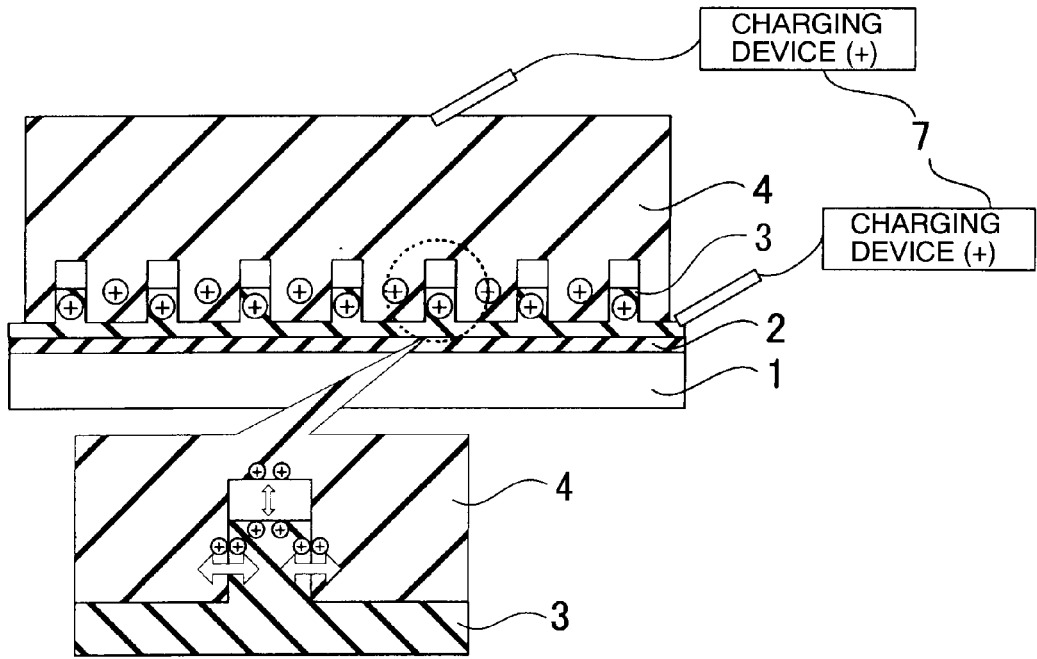

Here, a comparison will be performed between a case where the concave portion on the template 4 is fully filled with the organic material 3 and a case where not fully filled. FIG. 8A and FIG. 8B show the case where the concave portion on the template 4 is fully filled with the organic material 3 and the case where not fully filled, respectively.

As shown in FIG. 8A, in the case where the concave portion on the template 4 is fully filled with the organic material 3, by electrically charging the template 4 and the organic material 3 with an identical polarity, enough repulsion force is obtained between the template 4 and the organic material 3 at a time of template-removing. On the other hand, as shown in FIG. 8B, in the case where the concave portion on the template 4 is not fully filled with the organic material 3, there is a likelihood that the repulsion force between the template 4 and the organic material 3 may be week.

Therefore, by electrically charging the template 4 and the organic material 3 with the different polarities, the concave portion on the template 4 can be filled with the organic material 3. By such a manner, the template 4 can be easily removed from the organic material 3, thereby suppressing the defect on removing the template 4 and realizing high throughput.

Note that the template 4 and the organic material 3 can be electrically charged with the different polarities respectively before the template 4 is pressed on the organic material 3. Furthermore, as well as the first embodiment, the surface of the concave-convex patterns on the template 4 can be coated with a conductive film 9 such as a metallic film so that the electric charge is easily accumulated on the surface of the concave-convex patterns on the template 4. Because the electric charge is easily accumulated on the surface of the concave-convex patterns, the static electricity easily occurs between the template 4 and the organic material 3, thereby further suppressing the defect and realizing a high throughput. Therefore, it is preferable to use the conductive film 9.

Additionally, the presence/absence of the conductive film and the material of the conductive film can be varied respectively according to the rough/fine, shape and/or aspect ratio of the concave-convex patterns on the template 4. For example, as shown in FIG. 5B, the conductive film 9 can be formed on an area where the density of the pattern is high and the conductive film 9 may not be formed on another area where the density of the pattern is low. That is, the conductive film 9 can be formed only on an area where the density of the concave-convex pattern is higher than a predetermined value. Furthermore, as shown in FIG. 5C, because the frictional force of the pattern with the high aspect ratio at a time of template-removing is higher than that of the other patterns, in order to improve the static electricity, a second conductive film 11 can be formed on the pattern with a high aspect ratio, the conductive property of the second conductive film 11 being higher than that of the first conductive film 10 formed on other patterns.

Note that the conductive film can be formed at least on the surface of the concave portion on the template 4 and may not be formed on the surface of the convex portion on the template 4. Furthermore, although the surface of the concave-convex patterns on the template 4 may be coated with a removing agent for easy template-removing, this does not cause any problems because the removing agent has a thickness that does not disturb an influence of the static electricity.

Figure 9A:
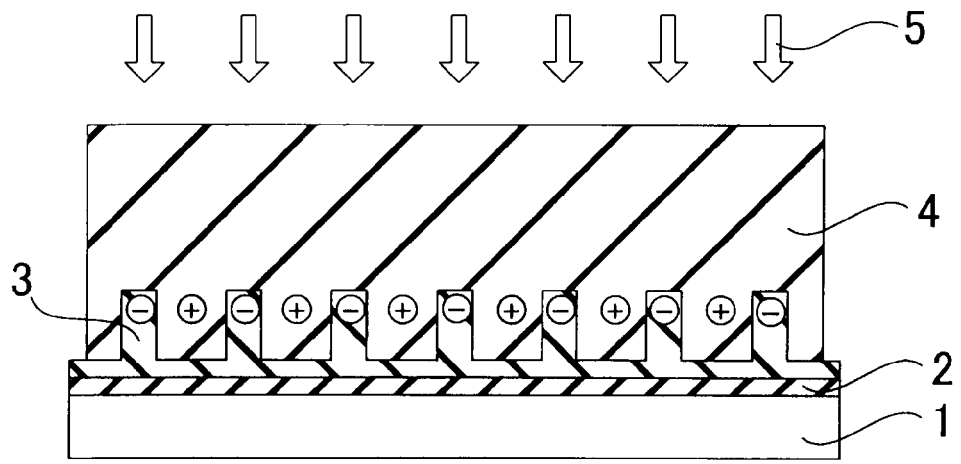
FIGS. 9A and 9B are process drawings schematically showing the pattern transfer method according to the second embodiment of the present invention.
Figure 9B:
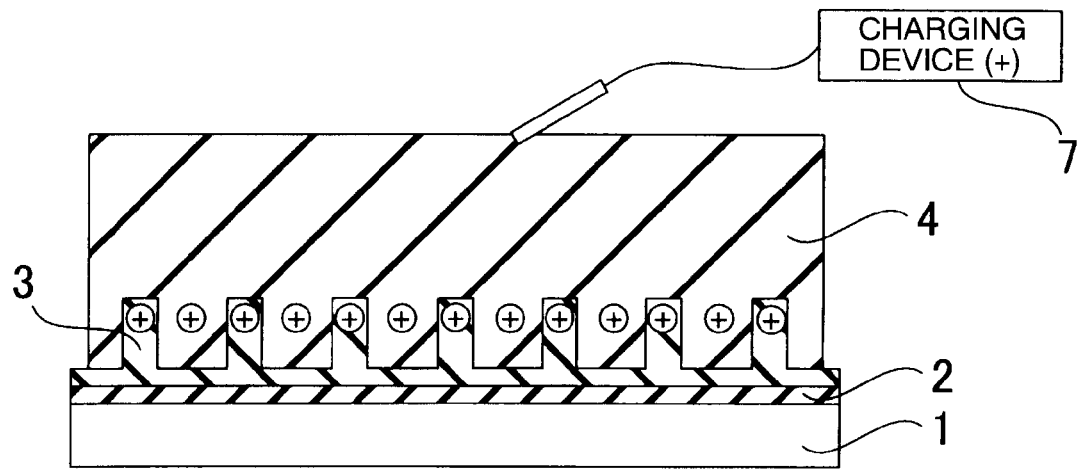

After the concave portion on the template 4 is filled with the organic material 3, as shown in FIG. 9A, the organic material 3 is cured by irradiating the light (UV) 5. Then, as shown in FIG. 9B, the template 4 and the organic material 3 are electrically charged with the identical polarity, for example. The subsequent processes are omitted because they are the identical as the first embodiment.

As mentioned above, with the pattern transfer method according to the second embodiment of the present invention, by electrically charging the template 4 and the organic material 3 with the different polarities when the template 4 is pressed, the concave portion on the template 4 can be filled with the organic material 3 efficiently. Therefore, the template 4 can be easily removed from the organic material 3, thereby suppressing the defect when removing the template 4 and realizing high throughput.

Third Embodiment

Figure 10A:
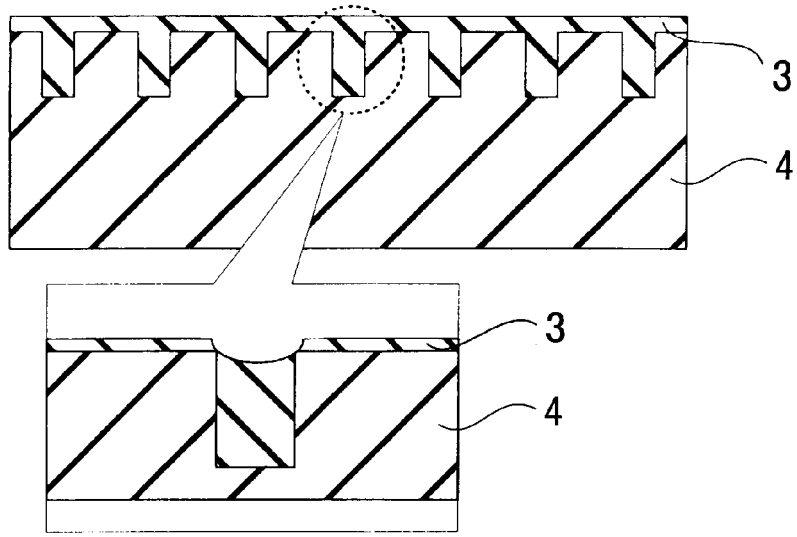
FIGS. 10A and 10B are process drawings schematically showing the pattern transfer method according to a third embodiment of the present invention.
Figure 10B:
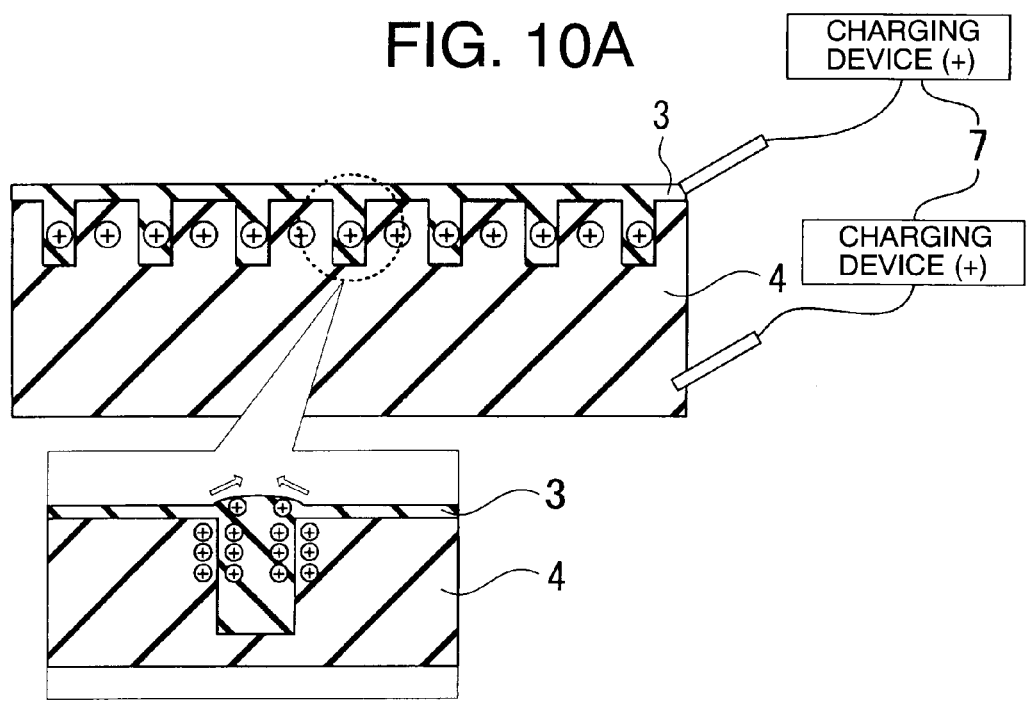

A pattern transfer method according to a third embodiment of the present invention will be explained. FIGS. 10A and 10B show process drawings of the pattern transfer method according to the third embodiment of the present invention, respectively. In the pattern transfer method according to the third embodiment of the present invention, it is one of the characteristic features that the occurrence of the pattern defect at a time of template-removing can be further suppressed by combining the modified embodiment of the first embodiment and the second embodiment. The present embodiment uses the imprint lithography process according to the Face-Up manner as well as the modified embodiment of the first embodiment.

Hereinafter, the present embodiment will be explained. The FIG. 10A shows a state where the template 4 is coated with the organic material 3. Here, because the organic material 3 is applied in a liquid state, as shown in the enlarged figure of FIG. 10A, there is a likelihood that the convex portion on the template 4 is not fully filled with the organic material 3 due to a surface tension of the organic material 3.

Therefore, in the present embodiment, as shown in FIG. 10B, after the organic material 3 is applied on the template 4, the template 4 and the organic material 3 are electrically charged by using the charging device 7.

More specifically, one side of the template 4 contacting with the organic material 3, namely, the side on which the concave-convex patterns are formed, and the surface of the organic material 3 are electrically charged with an identical polarity. In the present embodiment, the template 4 and the organic material 3 are positively charged, as an example.

The comparison between the case where the concave portion on the template 4 is fully filled with the organic material 3 and the case where not fully filled is similar the second embodiment. That is, in the case where the concave portion on the template 4 is fully filled with the organic material 3, by electrically charging the template 4 and the organic material 3 with the identical polarity, enough repulsion force is obtained between the template 4 and the organic material 3 at a time of template-removing. On the other hand, in the case where the concave portion on the template 4 is not fully filled with the organic material 3, there is a likelihood that the repulsion force between the template 4 and the organic material 3 may be week.

Therefore, by electrically charging the template 4 and the organic material 3 with the identical polarity when the template 4 is pressed, the concave portion on the template 4 can be filled with the organic material 3. By such a manner, the template 4 can be easily removed from the organic material 3, thereby suppressing the defect at a time of removing the template 4 and realizing high throughput.

Note that the template 4 and the organic material 3 can be charged with the identical polarity respectively before the template 4 is coated with the organic material 3. Furthermore, as well as the first embodiment, the surface of the concave-convex patterns on the template 4 can be coated with a conductive film 9 such as a metallic film so that the electric charge is easily accumulated on the surface of the concave-convex patterns on the template 4. Because the electric charge is easily accumulated on the surface of the concave-convex patterns, the static electricity easily occurs between the template 4 and the organic material 3, thereby further suppressing the defect and realizing a high throughput. Therefore, it is preferable to use the conductive film 9.

Additionally, the presence/absence of the conductive film and the material of the conductive film can be varied respectively according to the rough/fine, shape and/or aspect ratio of the concave-convex patterns on the template 4. For example, as shown in FIG. 5B, the conductive film 9 can be formed on an area where the density of the pattern is high and the conductive film 9 may not be formed on another area where the density of the pattern is low. That is, the conductive film 9 can be formed only on an area where the density of the concave-convex pattern is higher than a predetermined value. Furthermore, as shown in FIG. 5C, because the frictional force of the pattern with the high aspect ratio at a time of template-removing is higher than that of the other patterns, in order to improve the static electricity, a second conductive film 11 can be formed on the pattern with a high aspect ratio, the conductive property of the second conductive film 11 being higher than that of the first conductive film 10 formed on other patterns.

Note that the conductive film can be formed at least on the surface of the concave portion on the template 4 and may not be formed on the surface of the convex portion on the template 4. Furthermore, although the surface of the concave-convex patterns on the template 4 may be coated with a removing agent for easy template-removing, this does not cause any problems because the removing agent has a thickness that does not disturb an influence of the static electricity.

Figure 11A:
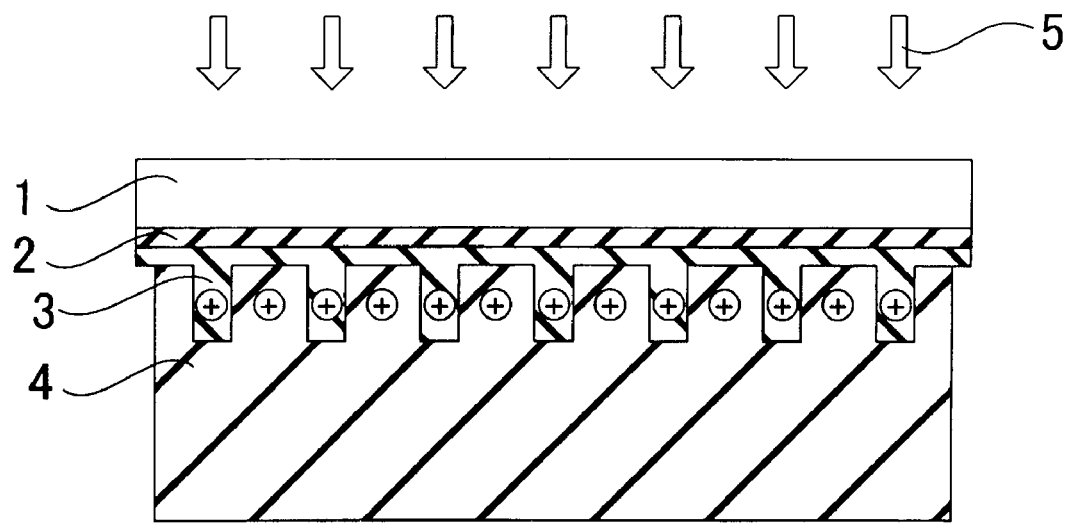
FIGS. 11A and 11B are process drawings schematically showing the pattern transfer method according to the third embodiment of the present invention.
Figure 11B:
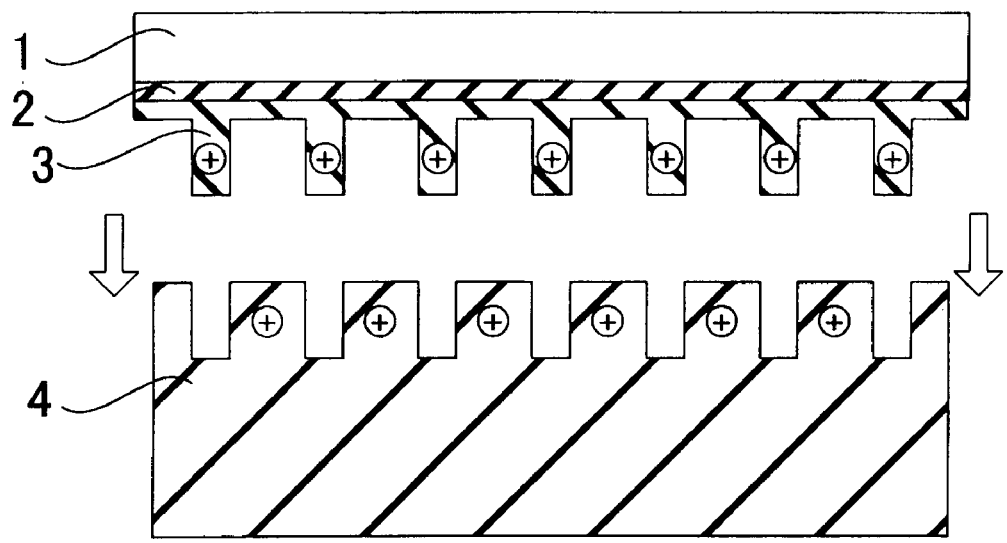

After the concave portion on the template 4 is filled with the organic material 3, as shown in FIG. 11A, after the template 4 is pressed on the transferred film 2 on the substrate 1, the organic material 3 is cured by irradiating the light (UV) 5. Then, as shown in FIG. 11B, the template 4 is removed.

In the present embodiment, because the template 4 and the organic material 3 are electrically charged with the identical polarity when the template 4 is filled with the organic material 3, it is unnecessary to electrically charge the template 4 and the organic material 3 again at a time of template-removing. Therefore, it is considered that the throughput can further improve more than that of the second embodiment.

After template-removing, the electric charges on the template 4 and the organic material 3 are removed by the static electricity removing device. Note that, when a plurality of shots are performed successively, next shot can be performed while the template 4 and the organic material 3 are electrically charged.

As mentioned above, with the pattern transfer method according to the third embodiment of the present invention, by electrically charging the template 4 and the organic material 3 with the identical polarity when the template 4 is pressed, the concave portion on the template 4 can be filled with the organic material 3 efficiently. Therefore, the template 4 can be easily removed from the organic material 3, thereby suppressing the defect when removing the template 4 and realizing high throughput. Furthermore, in the present embodiment, because it is possible to transfer the pattern successively without electrically changing the polarity after the template 4 and the organic material 3 are electrically charged once, higher throughput can be realized.

Note that the present invention is not limited to the above embodiments and can be performed by variously modifying the embodiments within the purpose of the invention.

The invention claimed is:

1. A pattern transfer method for filling a surface on a template having a concave-convex pattern with a resist material comprising:
    contacting the template with the resist material applied on a substrate;
    curing the resist material while contacting the template with the resist;
    electrically charging the template and the resist with an identical polarity; and
    removing the template from the resist material while electrically charging the template and the resist with an identical polarity.

2. The method of claim 1, wherein a conductive film is formed on a predetermined area on the surface of the concave-convex pattern on the template.

3. The method of claim 1, wherein a plurality of conductive films are formed depending on at least one of a density, a shape and an aspect ratio of the concave-convex pattern on the template, each of the conductive films having a different conductivity and being formed on a predetermined area on the surface of the concave-convex pattern on the template.

4. The method of claim 2, wherein as an aspect ratio of the concave-convex pattern on the template is larger, the conductive film with a higher conductivity is formed.

5. The method of claim 2, wherein the conductive film is formed only in the area where a density of the concave-convex pattern is larger than a predetermined value.

6. The method of claim 1 further comprising
filling the surface on the template having the concave-convex pattern with the resist material while electrically charging the template and the resist material with different polarities.

7. The method of claim 1 further comprising
removing electric charges on the template and the resist material.

8. A pattern transfer method for filling a surface on a template having a concave-convex pattern with a resist material comprising:
applying the resist material on the template;
contacting the template and the resist material with a substrate;
curing the resist material while contacting the template with the resist; and
removing the template from the resist material while electrically charging the template and the resist are charged with an identical polarity.

9. The method of claim 8 further comprising
filling the surface on the template having the concave-convex pattern with the resist while electrically charging the template and the resist material with the identical polarity before the template and the resist materials are contacted with the substrate.

10. The method of claim 8, wherein a conductive film is formed on a predetermined area on the surface of the concave-convex pattern on the template.

11. The method of claim 8, wherein a plurality of conductive films are formed according to at least one of a density, a shape and an aspect ratio of the concave-convex pattern on the template, each of the conductive films having a different conductivity and being formed on a predetermined area on the surface of the concave-convex pattern on the template.

12. The method of claim 10, wherein as an aspect ratio of the concave-convex pattern on the template is larger, the conductive film with a higher conductivity is formed.

13. The method of claim 10, wherein the conductive film is formed only in the area where a density of the concave-convex pattern is larger than a predetermined value.

14. The method of claim 8 further comprising
removing electric charges on the template and the resist material.

* * * * *